(12) United States Patent
Aoki et al.

(10) Patent No.: US 11,735,490 B2
(45) Date of Patent: Aug. 22, 2023

(54) SEMICONDUCTOR MODULE

(71) Applicant: Mitsubishi Electric Corporation, Tokyo (JP)

(72) Inventors: Nobuchika Aoki, Tokyo (JP); Yoshitaka Kimura, Tokyo (JP); Keisuke Eguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/397,344

(22) Filed: Aug. 9, 2021

(65) Prior Publication Data
US 2022/0270946 A1  Aug. 25, 2022

(30) Foreign Application Priority Data

Feb. 19, 2021 (JP) .................... 2021-025347

(51) Int. Cl.
*H01L 23/31* (2006.01)
*H01L 23/367* (2006.01)
*H01L 23/00* (2006.01)
*H01L 25/065* (2023.01)

(52) U.S. Cl.
CPC ........ *H01L 23/367* (2013.01); *H01L 23/3142* (2013.01); *H01L 24/32* (2013.01); *H01L 24/48* (2013.01); *H01L 25/0655* (2013.01); *H01L 2224/32225* (2013.01); *H01L 2224/48091* (2013.01); *H01L 2224/48175* (2013.01)

(58) Field of Classification Search
CPC ... H01L 23/367; H01L 23/3142; H01L 24/32; H01L 24/48; H01L 25/0655; H01L 2224/32225; H01L 2224/48091; H01L 2224/48175; H01L 24/49; H01L 24/73; H01L 2224/49109; H01L 2224/73265; H01L 2924/00014; H01L 2924/15156
See application file for complete search history.

(56) References Cited

U.S. PATENT DOCUMENTS

2013/0169149 A1\* 7/2013 Sato .................... C09K 11/7774
    313/512

FOREIGN PATENT DOCUMENTS

JP       2019-121794 A    7/2019

\* cited by examiner

*Primary Examiner* — Elias Ullah
(74) *Attorney, Agent, or Firm* — Studebaker & Brackett PC

(57) ABSTRACT

A semiconductor module includes: a dissipating metal plate including a recess provided on an upper surface; an insulating substrate provided on a bottom surface of the recess and including a circuit pattern; a semiconductor device provided on the insulating substrate and connected to the circuit pattern; a case bonded to a peripheral portion on the upper surface of the dissipating metal plate and surrounding the insulating substrate and the semiconductor device; a case electrode provided on the case; a wire connecting the semiconductor device and the case electrode; and a sealant provided in the case and sealing the insulating substrate, the semiconductor device, and the wire, wherein a sidewall of the recess has a taper.

12 Claims, 5 Drawing Sheets

SEMICONDUCTOR MODULE

BACKGROUND OF THE INVENTION

Field

The present disclosure relates to a semiconductor module.

Background

A conventional semiconductor module has been reduced in height by thinning a part of a dissipating metal plate to provide a recess and arranging an insulating substrate in the recess (see, e.g., Japanese Laid-Open Patent Publication No. 2019-121794).

SUMMARY

When a sealant is injected, air bubbles may be mixed into the sealant. Accordingly, there has been a problem that an insulation failure occurs unless an insulation distance between a circuit pattern in an insulating substrate and a sidewall of a recess on a dissipating metal plate is ensured. If the recess on the dissipating metal plate is widened, the insulation distance can be ensured. However, the area of a thinned portion increases. Therefore, there has been a problem that the dissipating metal plate decreases in rigidity and is vulnerable to a warping change.

The disclosure has been made to solve the above-described problem, and is directed to obtaining a semiconductor module capable of maintaining an insulating characteristic and a rigidity while being reduced in height.

A semiconductor module according to the present disclosure includes: a dissipating metal plate including a recess provided on an upper surface; an insulating substrate provided on a bottom surface of the recess and including a circuit pattern; a semiconductor device provided on the insulating substrate and connected to the circuit pattern; a case bonded to a peripheral portion on the upper surface of the dissipating metal plate and surrounding the insulating substrate and the semiconductor device; a case electrode provided on the case; a wire connecting the semiconductor device and the case electrode; and a sealant provided in the case and sealing the insulating substrate, the semiconductor device, and the wire, wherein a sidewall of the recess has a taper.

In the present disclosure, a low-height module can be implemented because the insulating substrate is provided on the bottom surface of the recess on the dissipating metal plate. Since the sidewall of the recess has the taper, the insulation distance between the dissipating metal plate and the circuit pattern in the insulating substrate can be ensured without the area of the thinned portion of the dissipating metal plate being increased. Therefore, an insulating characteristic and a rigidity can be maintained.

Other and further objects, features and advantages of the invention will appear more fully from the following description.

DESCRIPTION OF EMBODIMENTS

A semiconductor module according to the embodiments of the present disclosure will be described with reference to the drawings. The same components will be denoted by the same symbols, and the repeated description thereof may be omitted.

First Embodiment

Figure 1:
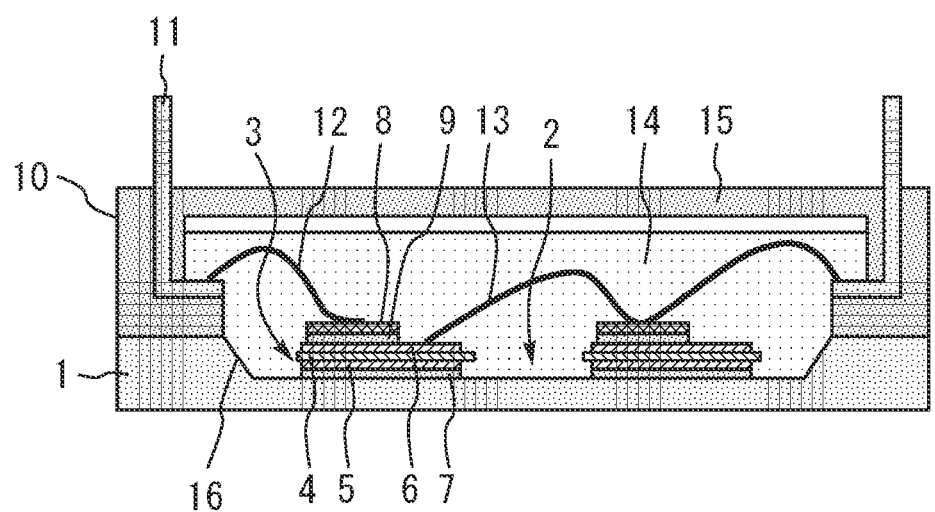
FIG. 1 is a cross-sectional view illustrating a semiconductor apparatus according to a first embodiment.

FIG. 1 is a cross-sectional view illustrating a semiconductor apparatus according to a first embodiment. A part of a dissipating metal plate 1 is thinned, and a recess 2 is provided in a central portion on an upper surface of the dissipating metal plate 1. An insulating substrate 3 is provided on a bottom surface of the recess 2.

The insulating substrate 3 includes an insulating plate 4 made of ceramic or the like, a metal pattern 5 provided on a lower surface of the insulating plate 4, and a circuit pattern 6 provided on an upper surface of the insulating plate 4. The metal pattern 5 in the insulating substrate 3 is bonded to the dissipating metal plate 1 with solder 7 interposed therebetween on the bottom surface of the recess 2.

A semiconductor device 8 is provided on the insulating substrate 3. A lower surface electrode of the semiconductor device 8 is bonded to the circuit pattern 6 with solder 9. A case 10 is bonded to a peripheral portion on the upper surface of the dissipating metal plate 1 and surrounds the insulating substrate 3 and the semiconductor device 8. The case 10 has a case electrode 11. An upper surface electrode of the semiconductor device 8 is connected to the case electrode 11 with a wire 12. The circuit pattern 6 is connected to a semiconductor device 8 on another insulating substrate 3 with a wire 13. A sealant 14 such as a silicone gel is provided in the case 10 and seals the insulating substrate 3, the semiconductor device 8, and the wires 12 and 13. A lid 15 is provided in an upper part of the water case 10.

A sidewall of the recess 2 has a taper 16. An angle formed between the bottom surface of the recess 2 and the taper 16 is larger than 90 degrees. Therefore, a stepped portion having a forward tapered shape opening upward is configured between the peripheral portion of the dissipating metal plate 1 and the bottom surface of the recess 2.

Figure 2:
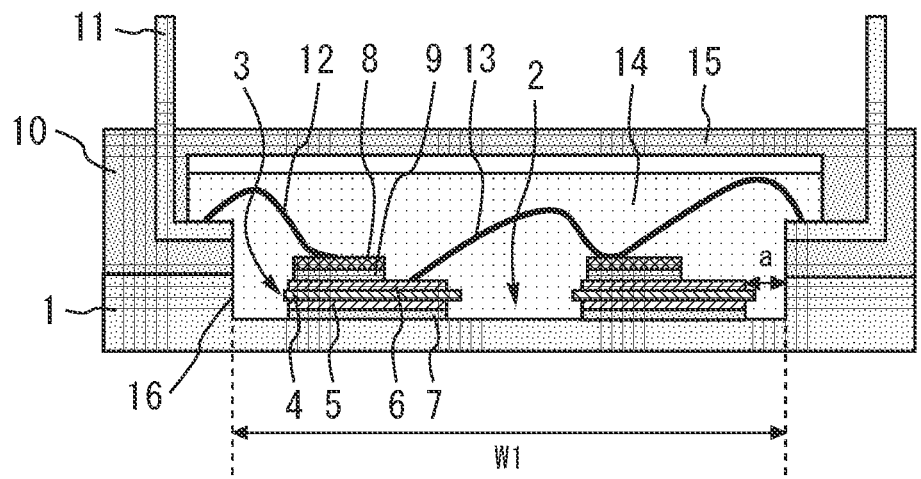
FIG. 2 is a cross-sectional view illustrating comparison between the first embodiment and comparative examples 1 and 2.
Figure 2:
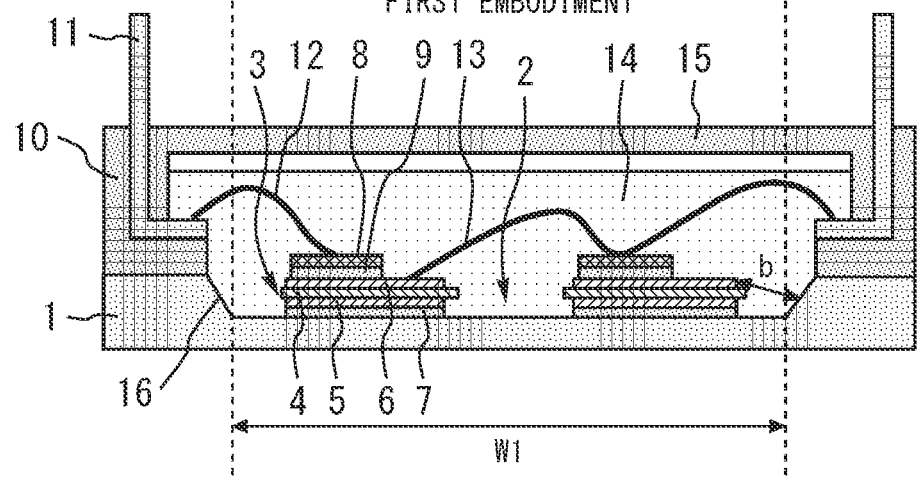
Figure 2:
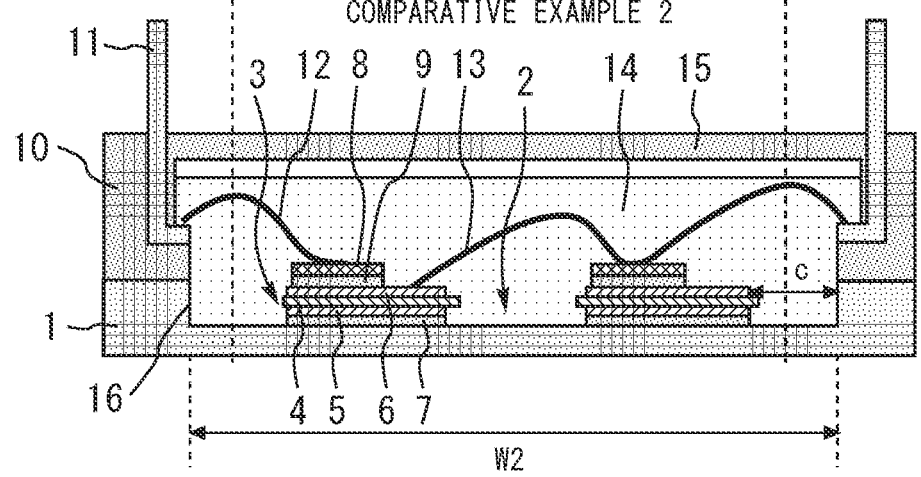

FIG. 2 is a cross-sectional view illustrating comparison between the first embodiment and comparative examples 1 and 2. In the comparative examples 1 and 2, a sidewall of a recess 2 is vertical. In the comparative example 1, a bottom surface of the recess 2 has a width W1, which is the same as that in the first embodiment. In the comparative example 1, an insulation distance a between a dissipating metal plate 1 and a circuit pattern 6 in an insulating substrate 3 is narrower than an insulation distance b in the first embodiment.

On the other hand, in the comparative example 2, a bottom surface of a recess 2 has a width W2, which is larger than W1. Accordingly, an insulation distance c in the comparative example 2 is larger than the insulation distance a in the comparative example 1 and the insulation distance b in the first embodiment. However, in the comparative example 2, the width W2 of the bottom surface of the recess 2 is large. Thus, the area of a thinned portion of a dissipating metal plate 1 increases. Therefore, the dissipating metal plate 1 decreases in rigidity, and is vulnerable to a warping change. On the other hand, in the first embodiment, the insulation distance between the dissipating metal plate 1 and the circuit pattern 6 in the insulating substrate 3 can be ensured without the area of a thinned portion of the dissipating metal plate 1 being increased.

As described above, in the present embodiment, a low-height module can be implemented because the insulating substrate 3 is provided on the bottom surface of the recess 2 on the dissipating metal plate 1. Since the sidewall of the recess 2 has the taper 16, the insulation distance between the dissipating metal plate 1 and the circuit pattern 6 in the insulating substrate 3 can be ensured without the area of the thinned portion of the dissipating metal plate 1 being increased. Therefore, an insulating characteristic can be maintained even when air bubbles are mixed into the sealant while a rigidity is ensured.

Second Embodiment

Figure 3:
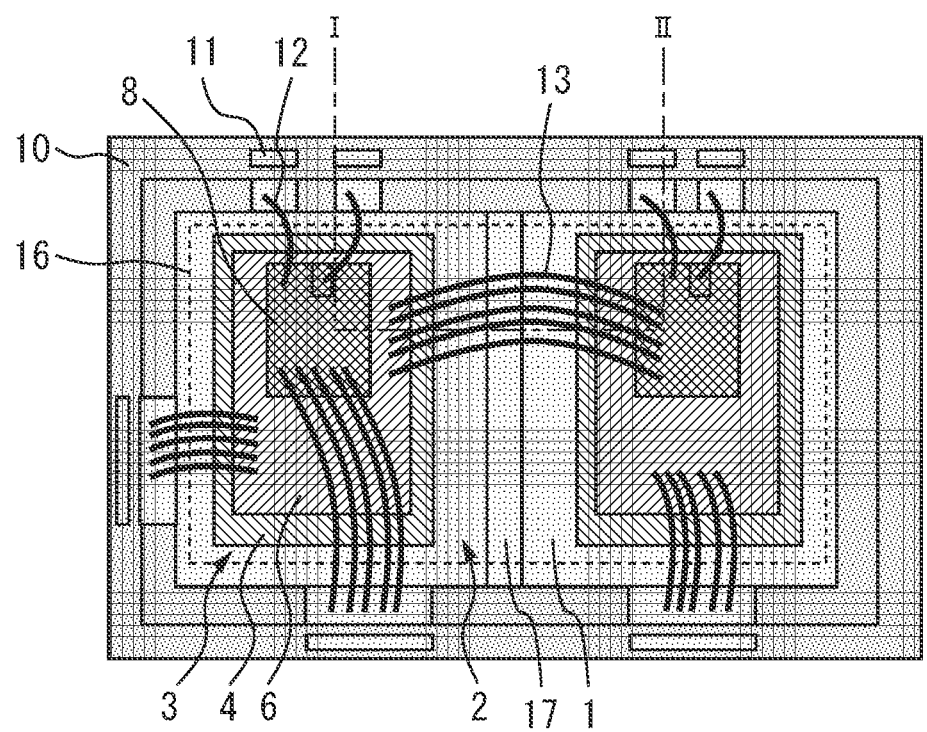
FIG. 3 is a plan view illustrating the interior of a semiconductor modules according to a second embodiment.
Figure 4:
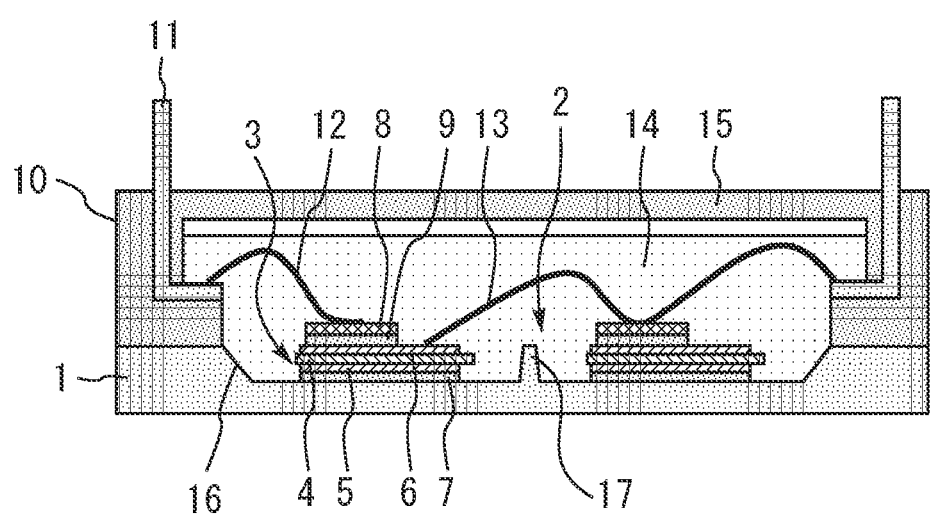
FIG. 4 is a cross-sectional view illustrating the semiconductor module according to the second embodiment.

FIG. 3 is a plan view illustrating the interior of a semiconductor modules according to a second embodiment. FIG. 4 is a cross-sectional view illustrating the semiconductor module according to the second embodiment. FIG. 4 is a cross-sectional view taken along a line I-II illustrated in FIG. 3.

A dissipating metal plate 1 includes one or more protrusion sections 17 protruding upward from a bottom surface of a recess 2 between two adjacent insulating substrates 3. A material for the protrusion section 17 is the same metal as a material for the dissipating metal plate 1. The thickness of the dissipating metal plate 1 increases in a portion provided with the protrusion section 17. Thus, the rigidity of a thinned portion of the dissipating metal plate 1 can be improved. This makes it possible to implement a module resistant to a warping change. Although the protrusion section 17 has a linear shape in a planar view, the rigidity of the dissipating metal plate 1 is improved even if the protrusion section 17 has a dot shape.

Third Embodiment

Figure 5:
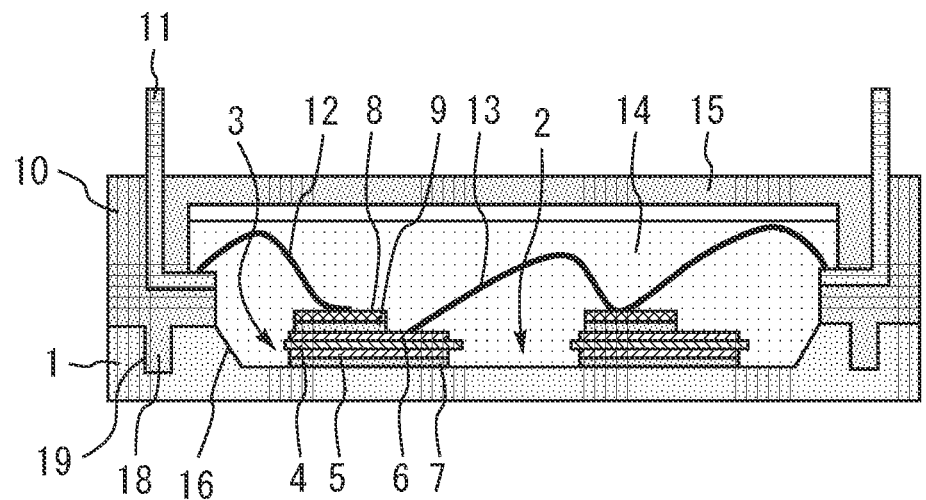
FIG. 5 is a cross-sectional view illustrating a semiconductor module according to a third embodiment.

FIG. 5 is a cross-sectional view illustrating a semiconductor module according to a third embodiment. A lower surface of a case 10 is provided with a protrusion 18. A peripheral portion on an upper surface of a dissipating metal plate 1 is provided with a depression 19. The protrusion 18 in the case 10 is inserted into the depression 19 in the dissipating metal plate 1. As a result, a bonding area between the dissipating metal plate 1 and the case 10 increases so that adhesion therebetween is improved. Therefore, a sealant 14 can be prevented from leaking out or spreading over from between the dissipating metal plate 1 and the case 10 so that the productivity of the module is improved.

Fourth Embodiment

Figure 6:
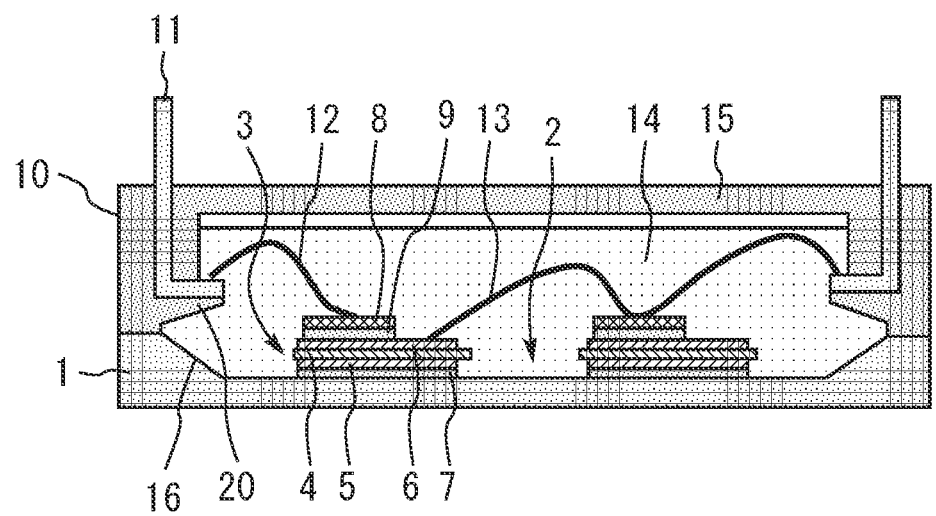
FIG. 6 is a cross-sectional view illustrating a semiconductor module according to a fourth embodiment.

FIG. 6 is a cross-sectional view illustrating a semiconductor module according to a fourth embodiment. A case 10 includes an overhanging section 20 swelling out to above a recess 2. Although the overhanging section 20 swells out to above a taper 16 of the case 10, the present invention is not limited to this. The overhanging section 20 may further swell out inward. A case electrode 11 is provided on the overhanging section 20.

When the case 10 is provided with the overhanging section 20, an insulation distance between a circuit pattern 6 in an insulating substrate 3 and a dissipating metal plate 1 can be further increased without a spacing between a semiconductor device 8 and the case electrode 11, which are wire-connected to each other, being changed. A lower surface of the overhanging section 20 preferably has a tapered shape. This makes it difficult for air bubbles to remain between the lower surface of the overhanging section 20 and the dissipating metal plate 1.

Fifth Embodiment

Figure 7:
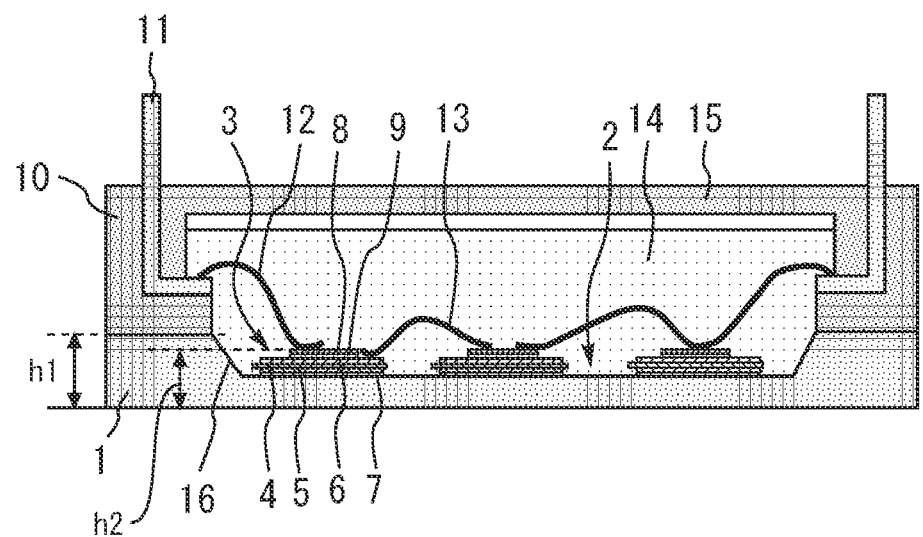
FIG. 7 is a cross-sectional view illustrating a semiconductor module according to a fifth embodiment.

FIG. 7 is a cross-sectional view illustrating a semiconductor module according to a fifth embodiment. A height h1 from a lower surface of a dissipating metal plate 1 to an upper surface of a peripheral portion of the dissipating metal plate 1 is larger than a height h2 from the lower surface of the dissipating metal plate 1 to an upper surface of a semiconductor device 8 (h1>h2).

This makes it possible to sufficiently ensure a distance from the upper surface of the semiconductor device 8 to a case electrode 11. Therefore, an insulating substrate 3 can be brought closer to a side surface of a recess 2 on the dissipating metal plate 1, and an effective area of the recess 2 on the dissipating metal plate 1 can be utilized to the maximum. Thus, a higher density of a low-height module can be realized.

Sixth Embodiment

Figure 8:
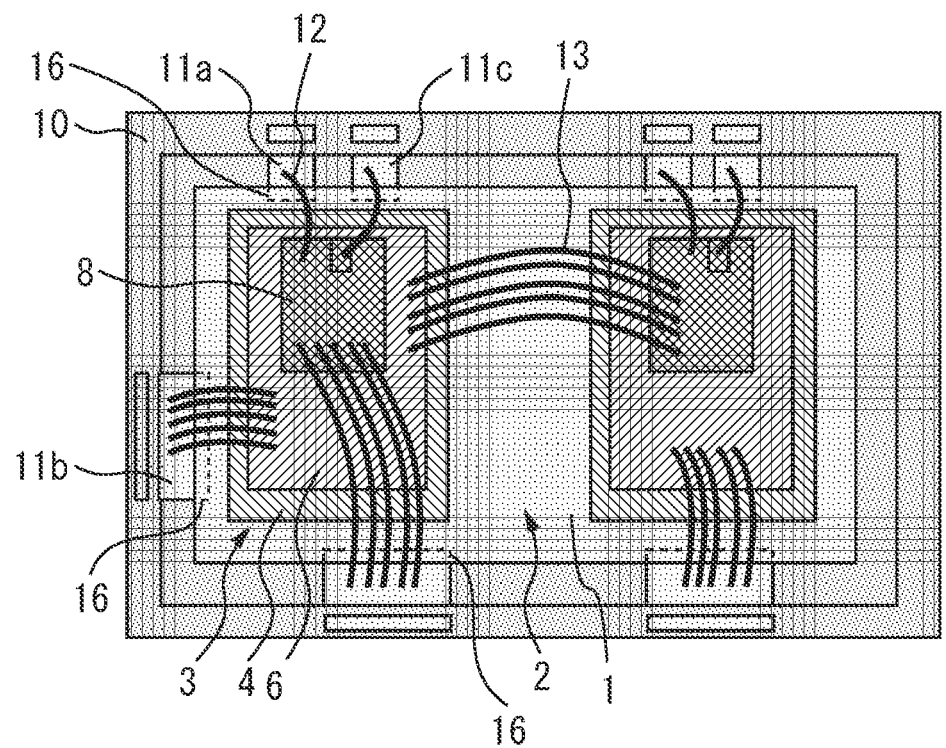
FIG. 8 is a plan view illustrating the interior of a semiconductor module according to a sixth embodiment.

FIG. 8 is a plan view illustrating the interior of a semiconductor module according to a sixth embodiment. A case electrode 11 includes main electrodes 11a and 11b and a signal electrode 11c. A taper 16 of a dissipating metal plate 1 is locally provided between a position just below a distal end portion of the case electrode 11 and an insulating substrate 3, and is not provided in other portions on a sidewall of a recess 2. This makes it possible to reduce the number of times of processing of the taper 16 of the dissipating metal plate 1. Thus, the productivity of the module is improved.

The semiconductor device 8 is not limited to a semiconductor device formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

There is an increasing market demand for a wide bandgap semiconductor that can be used at high temperature, and miniaturization and higher integration are desired. On the other hand, a configuration in each of the first to sixth embodiments makes it possible to further miniaturize a module and exhibits an effect in particular for a power module loaded with SiC.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-025347, filed on Feb. 19, 2021 including specification, claims, drawings and summary, on which the convention priority of the present application is based, is incorporated herein by reference in its entirety.

The invention claimed is:

1. A semiconductor module comprising:
a dissipating metal plate including a recess provided on an upper surface;
an insulating substrate provided on a bottom surface of the recess and including a circuit pattern;
a semiconductor device provided on the insulating substrate and connected to the circuit pattern;
a case bonded to a peripheral portion on the upper surface of the dissipating metal plate and surrounding the insulating substrate and the semiconductor device;
a case electrode provided on the case;
a wire connecting the semiconductor device and the case electrode; and
a sealant provided in the case and sealing the insulating substrate, the semiconductor device, and the wire,
wherein a sidewall of the recess has a taper.

2. The semiconductor module according to claim 1, wherein the dissipating metal plate includes a protrusion section protruding upward from the bottom surface of the recess.

3. The semiconductor module according to claim 2, wherein the recess is provided on the upper surface of the dissipating metal plate.

4. The semiconductor module according to claim 2, wherein the semiconductor device is provided on an upper surface of the insulating substrate.

5. The semiconductor module according to claim 1, wherein a lower surface of the case is provided with a protrusion, and
the peripheral portion on the upper surface of the dissipating metal plate is provided with a depression into which the protrusion is inserted.

6. The semiconductor module according to claim 1, wherein the case includes an overhanging section swelling out to above the recess, and
the case electrode is provided on the overhanging section.

7. The semiconductor module according to claim 6, wherein a lower surface of the overhanging section has a tapered shape.

8. The semiconductor module according to claim 1, wherein a height from a lower surface of the dissipating metal plate to an upper surface of the peripheral portion is larger than a height from the lower surface of the dissipating metal plate to an upper surface of the semiconductor device.

9. The semiconductor module according to claim 1, wherein the taper of the dissipating metal plate is locally provided between a position just below a distal end portion of the case electrode and the insulating substrate.

10. The semiconductor module according to claim 1, wherein the semiconductor device is made of a wide-bandgap semiconductor.

11. The semiconductor module according to claim 1, wherein the recess is provided on the upper surface of the dissipating metal plate.

12. The semiconductor module according to claim 1, wherein the semiconductor device is provided on an upper surface of the insulating substrate.

* * * * *